(12) United States Patent
Cui et al.

(10) Patent No.: US 11,291,131 B2
(45) Date of Patent: Mar. 29, 2022

(54) ELECTRICAL APPLIANCE DEVICE CONTAINING A KNOB

(71) Applicant: DIEHL AKO STIFTUNG & CO. KG, Wangen (DE)

(72) Inventors: Fengqun Cui, Nanjing (CN); Zhongke Li, Nanjing (CN)

(73) Assignee: Diehl AKO Stiftung & Co. KG, Wangen (DE)

( * ) Notice: Subject to any disclaimer, the term of this patent is extended or adjusted under 35 U.S.C. 154(b) by 2 days.

(21) Appl. No.: 16/773,267

(22) Filed: Jan. 27, 2020

(65) Prior Publication Data

US 2020/0253073 A1 Aug. 6, 2020

(30) Foreign Application Priority Data

Feb. 2, 2019 (CN) .............................. 201920185883

(51) Int. Cl.
| | |
|---|---|
| *H01H 19/14* | (2006.01) |
| *H05K 5/06* | (2006.01) |
| *H01H 19/00* | (2006.01) |
| *H01H 19/06* | (2006.01) |
| *H05K 5/00* | (2006.01) |
| *D06F 34/28* | (2020.01) |

(52) U.S. Cl.
CPC ........... *H05K 5/069* (2013.01); *H01H 19/005* (2013.01); *H01H 19/06* (2013.01); *H01H 19/14* (2013.01); *H05K 5/0017* (2013.01); *D06F 34/28* (2020.02)

(58) Field of Classification Search
CPC ...... H01H 19/14; H01H 19/025; H01H 19/11; H01H 19/04; H01H 19/54; H01H 19/64; H01H 19/46; H01H 19/10; H01H 19/03; H01H 19/38; H01H 19/001; H01H 19/02; H01H 19/06; H01H 19/08; H01H 19/20; H01H 19/36; H01H 19/00; H01H 19/50; H01H 19/56; H01H 19/60; H01H 19/62
See application file for complete search history.

(56) References Cited

U.S. PATENT DOCUMENTS

2019/0198202 A1* 6/2019 Stottinger ................ G05G 1/12
2019/0301744 A1* 10/2019 Yang ....................... F24C 3/122

* cited by examiner

*Primary Examiner* — Ahmed M Saeed
(74) *Attorney, Agent, or Firm* — Laurence A. Greenberg; Werner H. Stemer; Ralph E. Locher

(57) ABSTRACT

An electrical appliance device contains a knob which has a knob front assembly with a front cover assembly, a knob bracket, and a display module assembly disposed between the front cover assembly and the knob bracket, and a knob rear assembly including a circuit board and a hollow rotary encoder. The rotary encoder is mounted on the circuit board. The electrical appliance device further has a panel with an opening. The knob front assembly at least partially passes through the opening such as to be mounted to the knob rear assembly.

8 Claims, 6 Drawing Sheets

ELECTRICAL APPLIANCE DEVICE CONTAINING A KNOB

CROSS-REFERENCE TO RELATED APPLICATION

This application claims the priority, under 35 U.S.C. § 119, of China application CN 201920185883, filed Feb. 2, 2019; the prior application is herewith incorporated by reference in its entirety.

BACKGROUND OF THE INVENTION

Field of the Invention

The instant application relates to an electrical device containing a knob.

A circuit board is mounted below an operation panel of an electric appliance device such as a washing machine. When such electrical appliance device needs to be used in a high-humidity environment, if waterproof is not considered, water may seep into the circuit board directly from the keyhole in the panel or the gap between the cover plate and the knob, which results in a potential damage of the circuit board being wetted.

In the current electrical appliance device provided with a knob, the knob includes a display module assembly, since the knob does not have a desirable waterproof performance, it is likely to result in water leakage due to the gap between the cover plate and the knob. Moreover, the structure of the knob is also relatively complicated, and the production and assembly are inconvenient.

In addition, for hollow knobs commonly used at present, the inner guide groove of the fixing ring thereof is shallow. During the production and assembly, the guide groove which is blocked by the panel cannot be seen, so that it is likely to perform insertion wrongly. The outer rotary guide groove is also shallow with a fixed direction. Therefore, when it is blocked by the panel, it is likely to perform insertion wrongly, which results in that the rotation of the knob is not flexible.

SUMMARY OF THE INVENTION

In view of the above-described defects in the prior art, the instant application provides an electrical device containing a knob. Wherein, the modular structure of the knob has a simple design and excellent waterproof performance, and can be accurately and efficiently assembled.

According to one aspect of the instant application, there is provided an electrical appliance device containing a knob. The knob includes, a knob front assembly including a front cover assembly, a knob bracket, and a display module assembly disposed between the front cover assembly and the knob bracket, and a knob rear assembly including a circuit board and a hollow rotary encoder. The rotary encoder is mounted on the circuit board, the electrical appliance device further includes a panel including an opening, wherein the knob front assembly at least partially passes through the opening such as to be mounted to the knob rear assembly.

In one embodiment of the electrical appliance device, the front cover assembly and the knob bracket are fixedly assembled together, the display module assembly is fixed to an inner ring of the rotary encoder or the circuit board, and a gap is left between the display module assembly and the front cover assembly and the knob bracket, and the knob rear assembly is directly or indirectly fixed to a back surface of the panel.

In one embodiment of the electrical appliance device, the rotary encoder includes a rotary encoder inner ring guide pin or guide groove on the inner ring thereof, and the display module assembly correspondingly includes a display module guide groove or guide pin. The rotary encoder inner ring guide pin or guide groove is configured to be aligned and engaged with the display module guide groove or guide pin when the knob front assembly and the knob rear assembly are assembled.

In one embodiment of the electrical appliance device, the knob bracket includes a plurality of knob bracket guide grooves evenly distributed on an inner ring thereof, and the rotary encoder includes a plurality of rotary encoder outer ring guide grooves evenly distributed on an outer ring thereof. The knob bracket guide grooves and the rotary encoder outer ring guide grooves have an amount that is greater than or equal to three, and the knob bracket guide grooves and the rotary encoder outer ring guide grooves are capable of forming a tooth-like occluded relationship corresponding to each other.

In one embodiment of the electrical appliance device, a circuit board box for covering and protecting the knob rear assembly is attached between the knob rear assembly and the panel.

In one embodiment of the electrical appliance device, the circuit board box is a separate member or a member integrally formed on a back surface of the panel.

In one embodiment of the electrical appliance device, the knob further includes a fixing member for fixing the knob front assembly and the knob rear assembly together in a front-rear direction in a manner that the knob front assembly is capable of rotating freely.

In one embodiment of the electrical appliance device, the fixing member is an elastic clamp spring.

In one embodiment of the electrical appliance device, a plurality of button transmission members are provided on the knob bracket, and a plurality of mechanical buttons are provided on the circuit board, such that the knob front assembly is capable of actuating the plurality of button transmission members to cause the plurality of button transmission members to press the plurality of mechanical buttons in a one-to-one correspondence when the knob front assembly is pressed.

In one embodiment of the electrical appliance device, the display module assembly includes a display screen and a display screen base, wherein a sensor is provided on the display screen or inside the display screen.

In one embodiment of the electrical appliance device, the sensor includes one or both of a gesture control sensor and a proximity induction sensor.

In one embodiment of the electrical appliance device, the electrical appliance device is a washing machine, clothes dryer, a refrigerator, a dishwasher or a cooktop.

Unlike the knob with a display function in the prior art, the knob included in the electrical appliance device according to the instant application can not only achieve excellent waterproof performance as well as modular supply and assembly with less parts and less assembly steps, and can modify and update the display module assembly in a manner of making less modifications by only changing the type of the display elements.

By considering the following description of the preferred embodiments of the instant application in conjunction with the accompanying drawings, various objects, features, and advantages of the instant application will become more apparent. The drawings are merely exemplary illustrations of the instant application and are not necessarily drawn to scale. In the accompanying drawings, the same reference signs always refer to the same or similar parts.

Other features which are considered as characteristic for the invention are set forth in the appended claims.

Although the invention is illustrated and described herein as embodied in electrical appliance device containing a knob, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
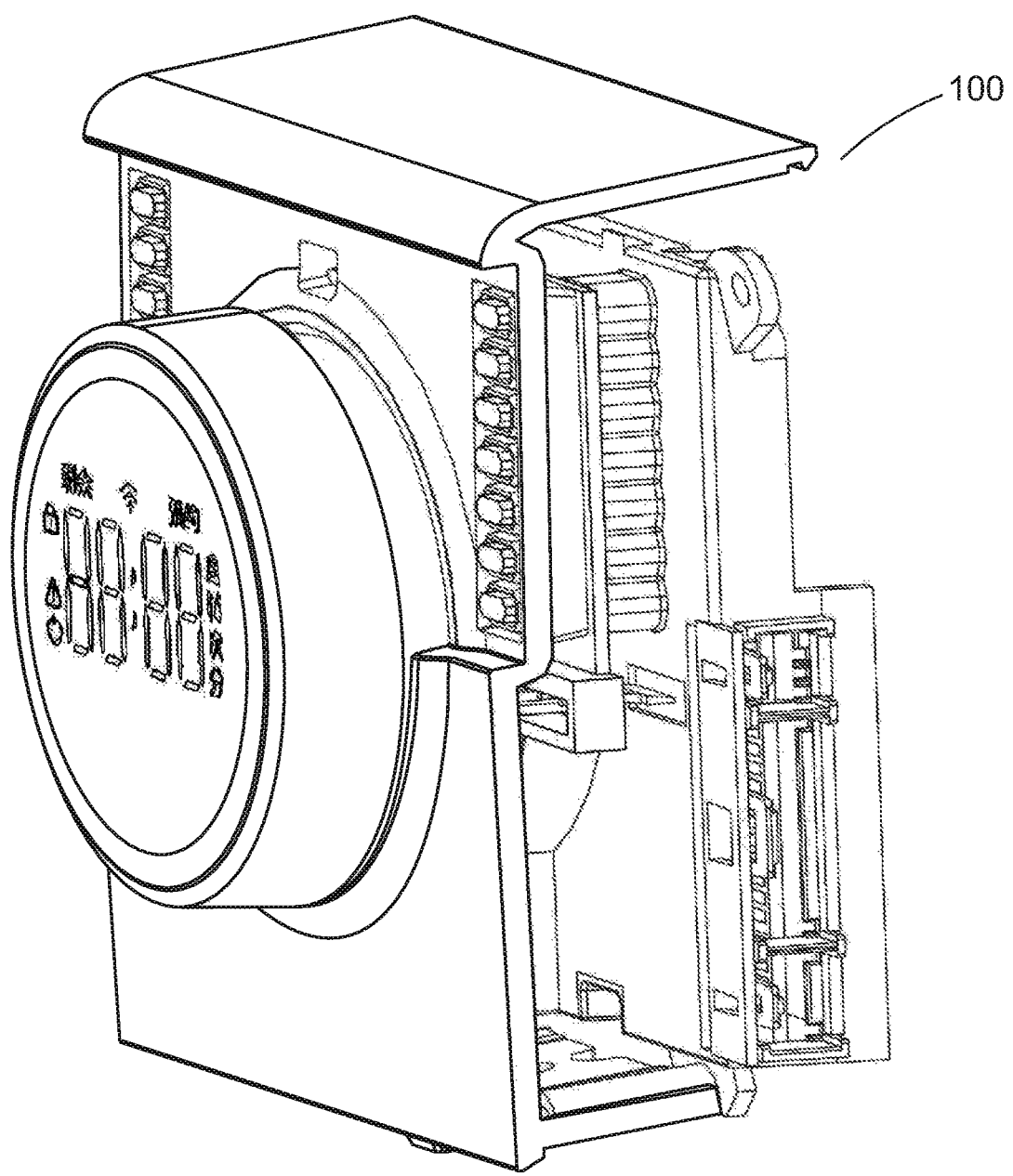
FIG. 1 is a diagrammatic, perspective view of a knob included in an electrical device according to the invention.

The present disclosure will be described below with reference to the accompanying drawings, in which preferred embodiments of the present disclosure are shown. It should be understood, however, that the present disclosure can be presented in multiple different ways, and not limited to the embodiments described below. In fact, the embodiments described hereinafter are intended to make a more complete disclosure of the present disclosure and to adequately explain the protection scope of the present disclosure to a person skilled in the art. It should also be understood that, the embodiments disclosed herein can be combined in various ways to provide more additional embodiments. Those skilled in the art may appropriately modify the detailed configurations without departing from the scope of the gist of the present disclosure.

It should be understood that, in all the accompanying drawings, the same reference signs present the same elements. In the drawings, for the sake of clarity, the sizes of certain features may be deformed.

Unless otherwise stated, the terms (including technical terms and scientific terms) used herein shall have meanings that can be generally understood by those skilled in the technical field to which the instant application relates. Unless otherwise stated, the terms "comprising" and "including" used in the specification and claims should be interpreted in an open sense. That is, the terms "comprising" and "including" should be interpreted to be synonymous with the terms "at least comprising" and "at least including"

Unless otherwise stated, the terms "upper", "lower", "top", "bottom" and the like used in the instant application are relative orientations of the knob in the state shown in the drawings.

It should be understood that, the wording in the specification is only used for describing particular embodiments and is not intended to define the present disclosure. For the sake of conciseness and/or clarity, the well-known functions or constructions may not be described in detail any longer.

In view of the above-described defects in the prior art, the instant application provides a knob with a display function.

The embodiments for implementing the present disclosure will be described below with reference to the drawings.

Figure 2:
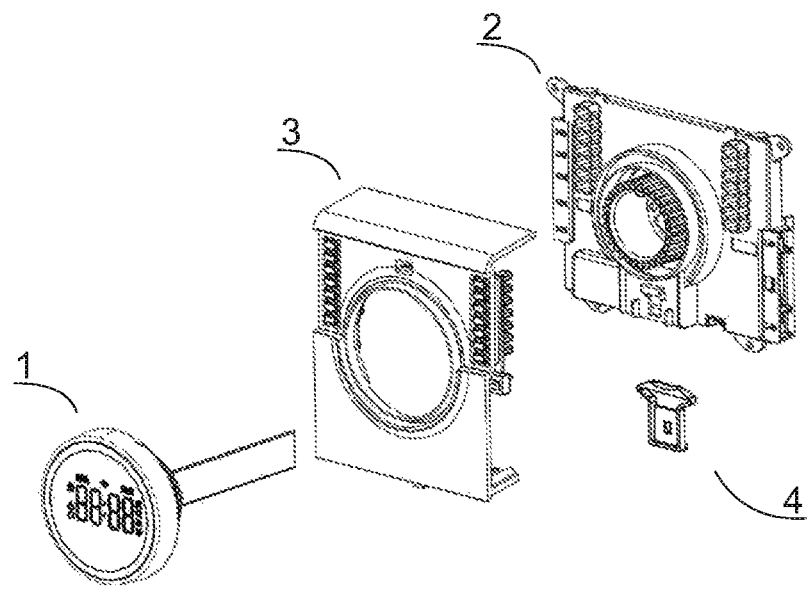
FIG. 2 is an exploded, perspective view of the knob according to the invention.
Figure 3:
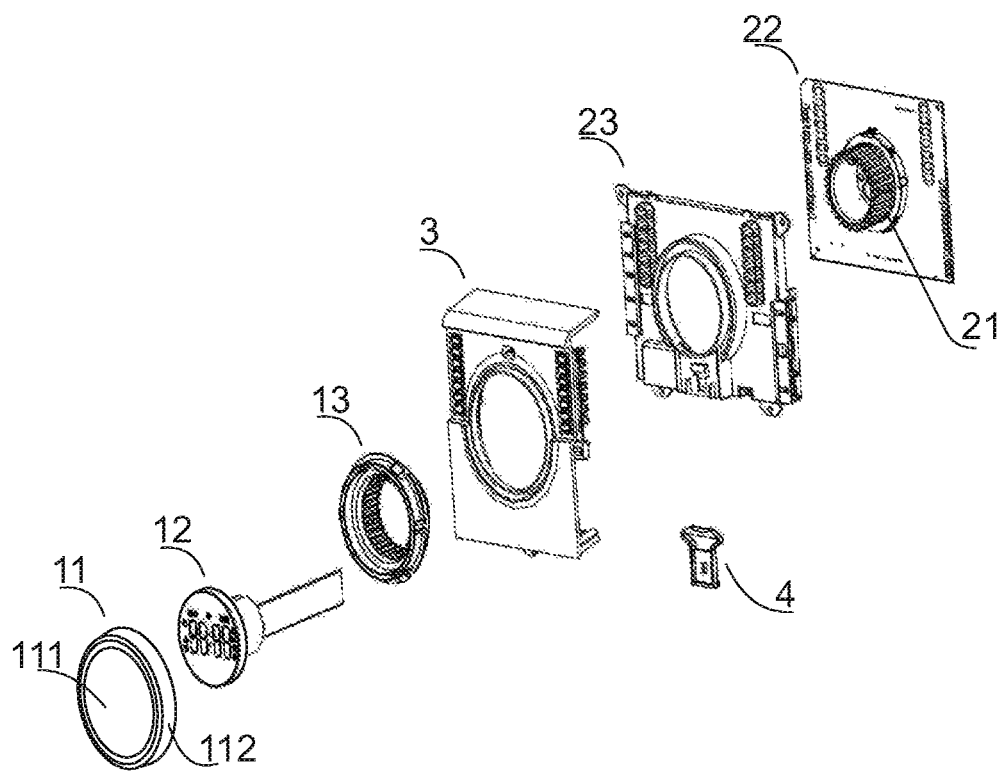
FIG. 3 is an exploded, perspective view of the knob after further disassembly according to the invention.

Referring now to the figures of the drawings in detail and first, particularly to FIG. 1 thereof, there is shown an overall perspective view of a knob 100 included in an electrical device according to the instant application. FIG. 2 is an exploded schematic view of the knob 100 according to the present invention. FIG. 3 is an exploded view of the knob 100 according to the present invention model after further disassembly.

As shown in FIGS. 1 and 2, the electric appliance device according to the instant application contains the knob 100 and a panel 3, and the knob 100 includes a knob front assembly 1 and a knob rear assembly 2. The panel 3 of the electrical appliance device includes an opening, wherein the knob front assembly 1 can at least partially pass through the opening such as to be mounted on the knob rear assembly 2. The knob rear assembly 2 is fixed to the back surface of the panel 3. Alternatively, the knob rear assembly 2 can be directly fixed to the back surface of the panel 3 in a snap-fit fixing manner or screw fixing manner. Alternatively, the electrical appliance device may be a washing machine, clothes dryer, a refrigerator, a dishwasher, or a cook top.

Specifically, as shown in FIG. 3, the knob front assembly 1 includes a front cover assembly 11, a knob bracket 13, and a display module assembly 12 having a display function which is disposed between the front cover assembly 11 and the knob bracket 13. The front cover assembly 11 includes a front display window 111 and a knob contact area 112. The user can view the display content of the display module assembly 12 through the front display window 111, and the user can realize the rotation adjustment of the knob 100 by turning the knob contact area 112. The front display window 111 and the knob contact area 112 can be integrally injection-molded. Alternatively, the front display window 111 and the knob contact area 112 may also be integrally assembled by double-sided tape, snap-fit, glue, ultrasonic welding, or the like. In the case of an ordinary knob, the front display window 111 and the knob contact area 112 form a cylindrical structure. In the case of a flat knob, the front display window 111 and the knob contact area 112 form a planar or nearly planar structure.

Further, as shown in FIG. 3, the knob rear assembly 2 includes a circuit board 22 and a hollow rotary encoder 21, wherein the rotary encoder 21 is mounted on the circuit board 22. By the combined arrangement of the front cover assembly 11, the knob bracket 13 and the panel 3, which will be described in detail below, it is possible to advantageously protect the display module assembly 12 and the circuit board 22, and provide excellent waterproof performance.

Alternatively, a circuit board box 23 for covering and protecting the knob rear assembly 2 (i.e., the rotary encoder 21 and the circuit board 22) may be attached between the knob rear assembly 2 and the panel 3. In this case, the knob rear assembly 2 may be indirectly fixed to the back surface of the panel 3 via the attached circuit board box 23. The circuit board box 23 may be a separate member or a member integrally formed on the back surface of the panel 3. By providing the circuit board box 23, it is possible to further improve the waterproof effect over the knob rear assembly 2 (i.e., the rotary encoder 21 and the circuit board 22).

In addition, as shown in FIGS. 2 and 3, after the knob front assembly 1 is assembled to the knob rear assembly 2, the knob front assembly 1 and the knob rear assembly 2 may be fixed together in the front-rear direction by using a fixing member 4. This makes it impossible to pull out the knob front assembly 1 from the front of the panel 3, but the knob front assembly 1 may still rotate freely. The fixing member 4 may be fixed to the back surface of the panel 3, or may be fixed to the circuit board box 23. Alternatively, the fixing member 4 is an elastic clamp spring.

Figure 4:
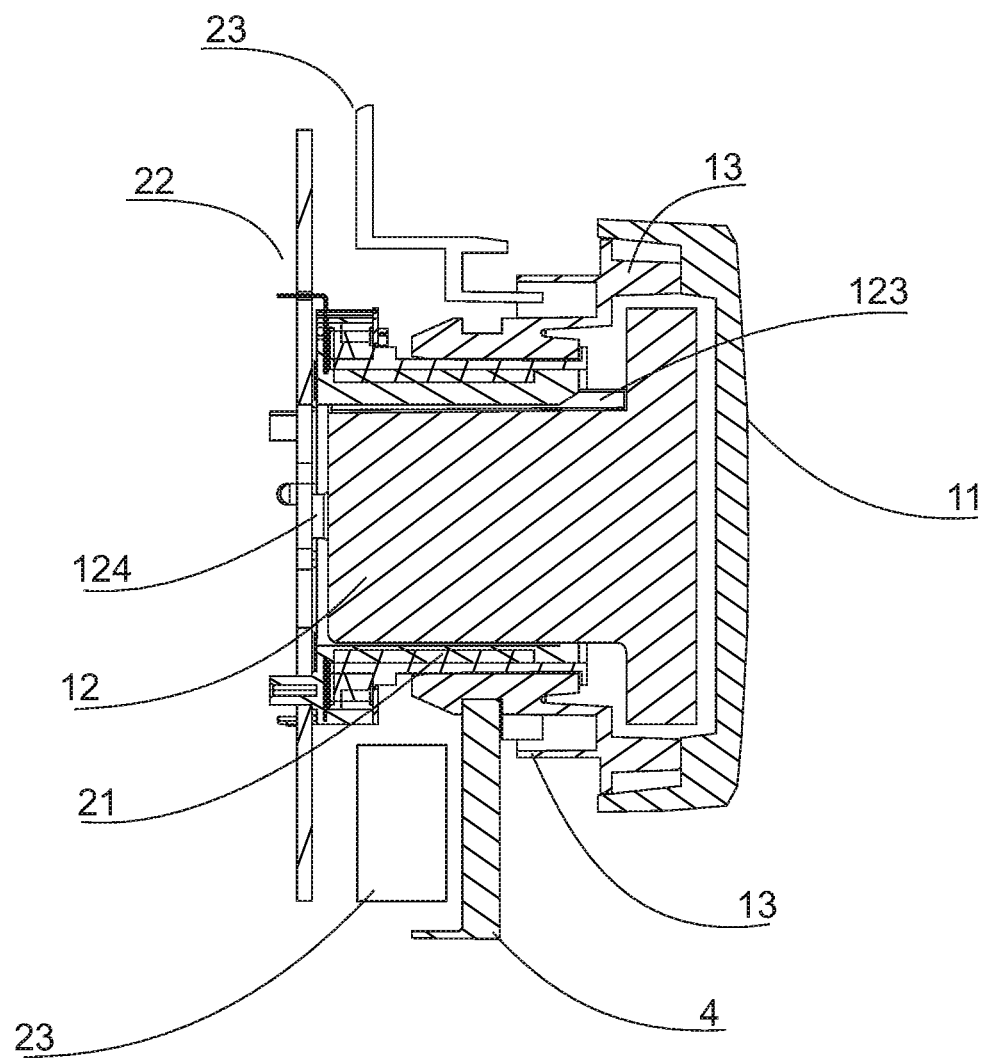
FIG. 4 is a sectional view of the knob according to the invention.

FIG. 4 is a sectional view of the knob according to the instant application. As shown in FIG. 4, during the assembly process, the front cover assembly 11 and the knob bracket 13 are fixedly assembled together. When the display module assembly 12 is installed, the display module assembly 12 is fixed to the inner ring of the rotary encoder 21 or the circuit board 22 in a snap-fit fixing or screw fixing manner from the back surface of the circuit board 22, and after the fixing is completed, a gap is left between the display module assembly 12 and the front cover assembly 11 and the knob bracket 13, so that it is possible to avoid the friction between the display module assembly 12 and the front cover assembly 11 and the knob bracket 13. Since the display module assembly 12 is fixed to the inner ring of the rotary encoder 21 or the circuit board 22, there is no substantial fixing relationship between the display module assembly 12 and the front cover assembly 11 and the knob bracket 13. In this way, when the user rotates the knob 100 to rotate the assembly of the front cover 11 and the knob bracket 13, the display module assembly 12 can be retained stationary inside the assembly and avoids frictional engagement. Unlike the knob having a display function in the prior art, the knob of the instant application can achieve excellent waterproof performance as well as modular supply and assembly with less parts and less assembly steps, and can achieve the knob effect that "the front cover assembly 11 rotates while the display module assembly 12 inside does not rotate".

Figure 5:
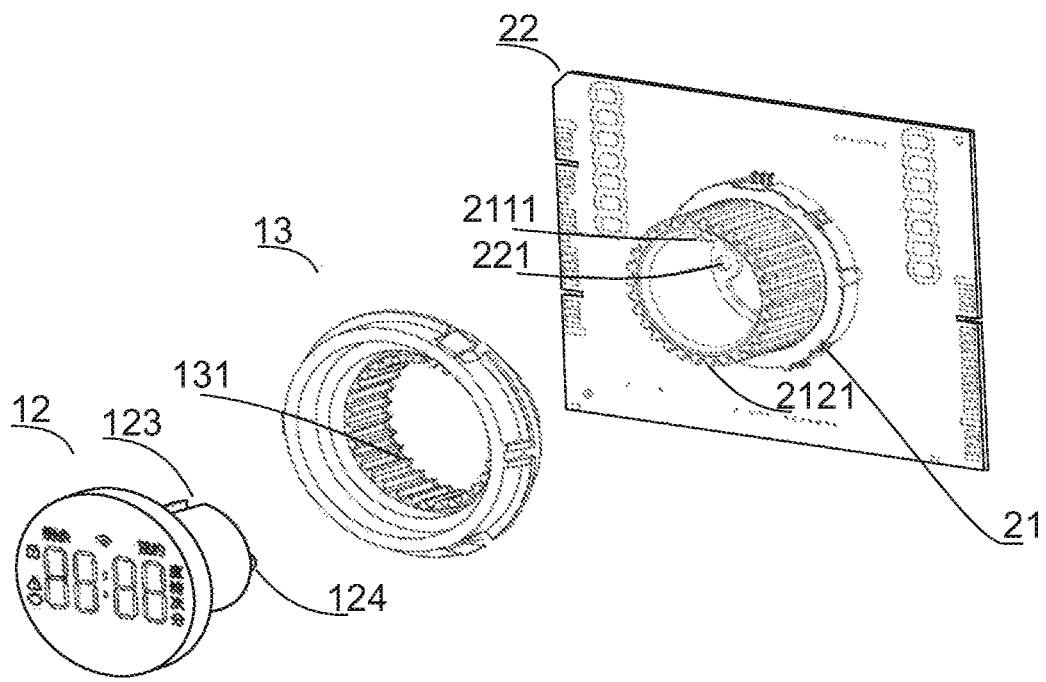
FIG. 5 is an exploded, perspective view of a display module assembly, a knob bracket, a hollow rotary encoder, and a circuit board in the knob according to the invention.
Figure 6:
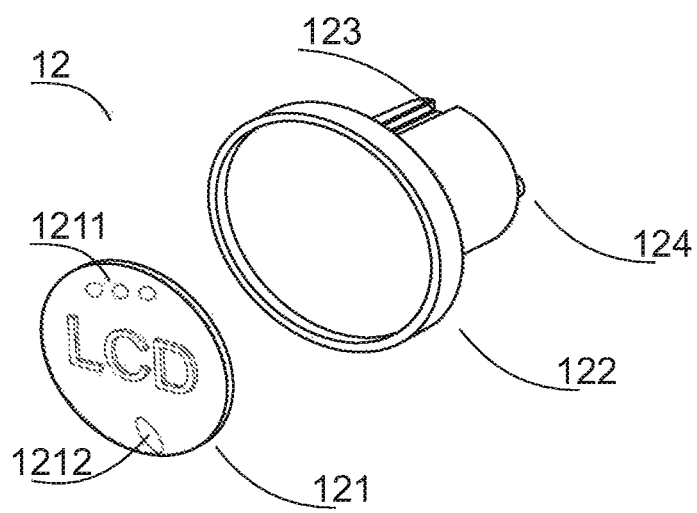
FIG. 6 is an exploded, perspective view of the display module assembly in the knob according to the invention.
Figure 7:
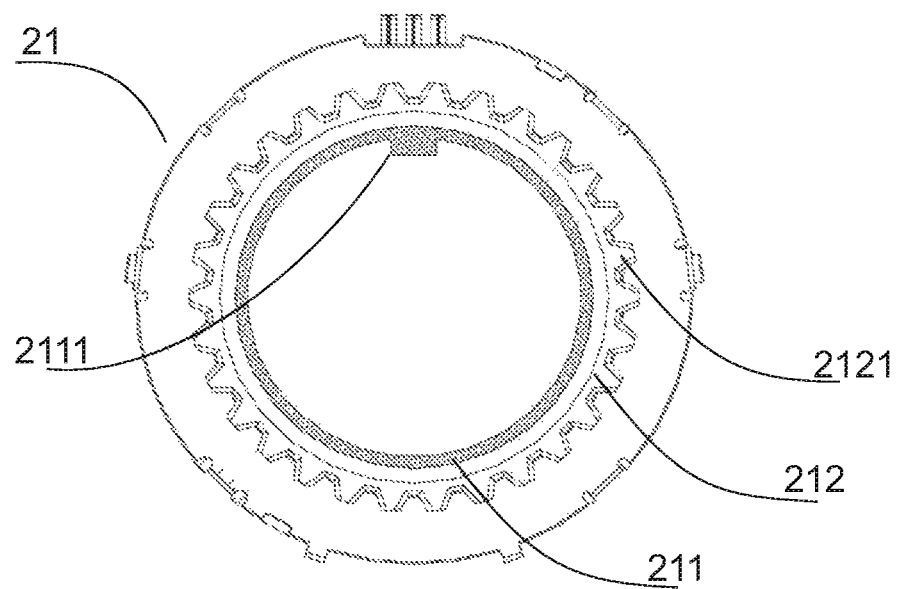
FIG. 7 is a front view of a rotary encoder in the knob according to the invention.

FIG. 5 is a schematic view of a display module assembly, a knob bracket, a hollow rotary encoder, and a circuit board in the knob according to the instant application. FIG. 6 is an exploded schematic view of a display module assembly in the knob 100 according to the instant application. FIG. 7 is a front view of a rotary encoder in the knob 100 according to the instant application. As shown in FIG. 5, the display module assembly 12 may include an LED display element, a display module guide groove 123, and a display module fixing portion 124 that are integrally formed. Alternatively, as shown in FIG. 6, the display module assembly 12 may include a display screen 121, a display screen base 122, a display module guide groove 123, and a display module fixing portion 124, wherein the display screen 121 may be an LCD display element. Those skilled in the art should realize that, according to the configuration shown in FIG. 6, the display screen can conveniently use other display elements as an alternative, such as a TFT display element, a segmented code display element or an OLED display element, so that it is possible to modify and update the display module assembly in a manner of making less modifications by only changing the type of the display elements. Alternatively, a specific type of sensor such as a gesture control sensor 1211 and/or a proximity induction sensor 1212 may be provided on the display screen or inside the display screen. Wherein, the gesture control sensor 1211 is used to control related parameters in a contactless manner, and the proximity sensor 1212 is used to trigger the corresponding display content and/or acoustic feedback when the distance between the user's hand and the knob is less than a predetermined threshold.

As shown in FIGS. 5 to 7, the knob bracket 13 includes a plurality of knob bracket guide grooves 131 evenly distributed in an inner ring thereof, and a tooth-like structure is formed between these knob bracket guide grooves 131. The hollow rotary encoder 21 includes a rotary encoder inner ring guide pin 2111 on its inner ring 211 and a plurality of rotary encoder outer ring guide grooves 2121 evenly distributed on its outer ring 212, and a tooth-like structure is also formed between these rotary encoder outer ring guide grooves 2121. In addition, the circuit board 22 may be provided with a display module assembly fixing hole 221.

When the knob front assembly 1 and the knob rear assembly 2 are assembled, it is only necessary to align the rotary encoder inner ring guide pin 2111 of the rotary encoder 21 with the display module guide groove 123 of the display module assembly 12 and engage them with each other. Those skilled in the art should realize that, it is also possible to make such a modification that a display module guide pin is provided on the display module assembly 12, and a rotary encoder inner ring guide groove is provided in the inner ring of the rotary encoder 21 correspondingly. Such mated structure of the guide pin and the guide groove can facilitate the assembly, and can ensure the assembly accuracy.

After the knob front assembly 1 is assembled to the knob rear assembly 2, the knob bracket guide groove 131 of the knob bracket 13 and the rotary encoder outer ring guide groove 2121 of the rotary encoder 21 form a tooth-like occluded relationship corresponding to each other, and the display module fixing portion 124 of the display module assembly 12 is engaged into the display module assembly fixing hole 221 on the circuit board 22. The knob bracket guide grooves 131 and the rotary encoder outer ring guide grooves 2121 should have an amount of three or more, and both are provided to be evenly distributed. Accordingly, it is possible not to consider the direction when the knob bracket 13 and the rotary encoder 21 are assembled, and it is possible to avoid inflexible rotation resulting from wrong installation. The tooth-like occlusion having three teeth or more can ensure a small assembly gap with less vibration.

Figure 8:
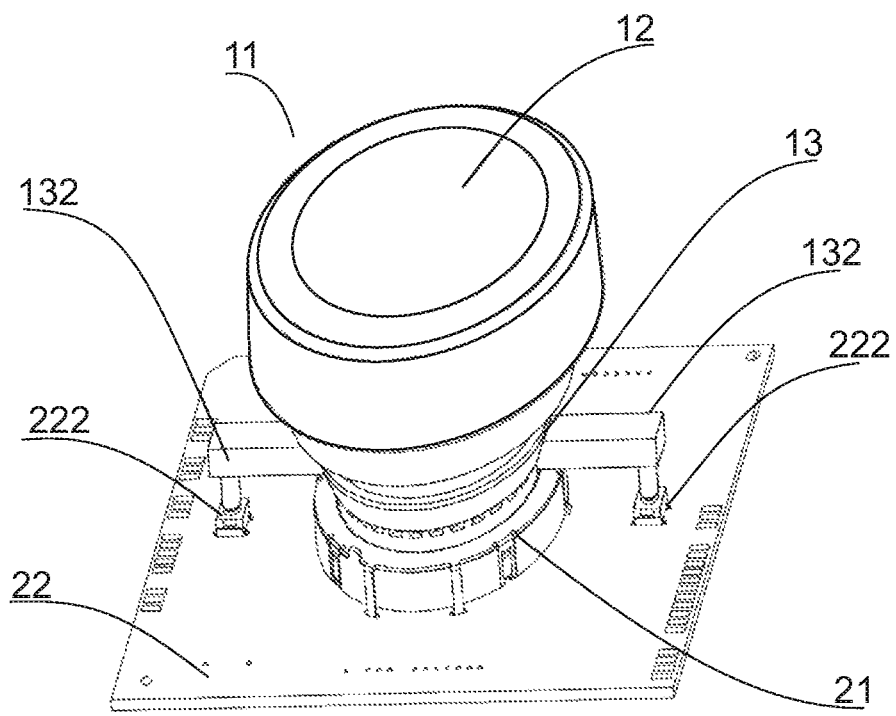
FIGS. 8 and 9 are perspective views of a button transmission structure and a mechanical button in the knob according to the invention.
Figure 9:
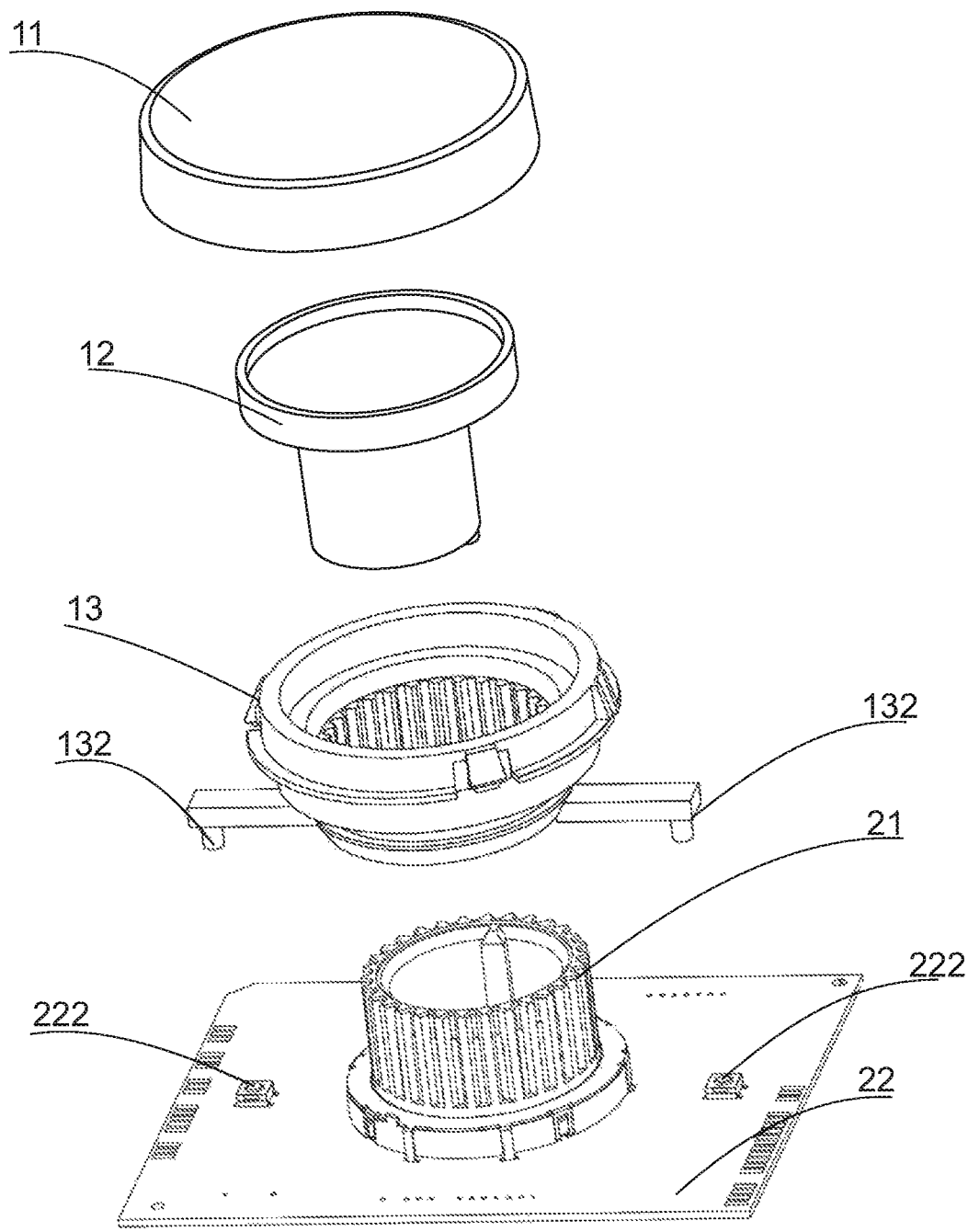

FIGS. 8 and 9 are schematic views of providing a button transmission structure and a mechanical button in the knob according to the instant application. As shown in FIGS. 8 and 9, alternatively, a button transmission member 132 can be provided on the knob bracket 13, and a mechanical button 222 is correspondingly provided on the circuit board 22. The button transmission members 132 and the mechanical buttons 222 have an amount of at least two. When the user presses the knob front assembly 1, in conjunction with the vertical guide function of the knob bracket guide groove 131, the button transmission member 132 on the knob bracket 13 can be actuated so that the button transmission member 132 can press the mechanical button 222 in one-to-one correspondence, thereby implementing a corresponding function. For example, the "confirmation" function can be implemented by pressing the knob front assembly 1 after rotating the knob 100.

The knob 100 for the electrical appliance device according to the instant application can be applied to various types of washing machines, clothes dryers, refrigerators, dishwashers or cook tops.

Although the present disclosure has been described with reference to exemplary embodiments, those skilled in the art will understand that, various modifications and variations may be made to the exemplary embodiments of the present disclosure without substantively departing from the spirit and scope of the present disclosure. Accordingly, all modifications and variations are encompassed within the protection scope of the present disclosure as defined by the appended claims. The protection scope of the present disclosure is defined by the appended claims, and equivalent solutions of these claims are also contained.

The invention claimed is:

1. An electrical appliance device, comprising:
a knob containing:
a knob front assembly having a front cover assembly with a front window and a knob contact area, a knob bracket rotationally fixed to said knob contact area for rotating said knob bracket and said front cover assembly together, said front cover assembly and said knob bracket being fixedly assembled together, and a display module assembly disposed between said front cover assembly and said knob bracket;
a knob rear assembly including a circuit board and a hollow rotary encoder, said hollow rotary encoder is mounted on said circuit board, said hollow rotary encoder having an inner ring, and said display module assembly being fixed to said inner ring of said hollow rotary encoder or said circuit board, said inner ring of said hollow rotary encoder having a rotary encoder inner ring guide pin or guide groove formed therein;
said display module assembly correspondingly having a display module guide groove or guide pin formed therein;
said rotary encoder inner ring guide pin or guide groove being configured to be aligned and engaged with said display module guide groove or guide pin when said knob front assembly and said knob rear assembly are assembled;
said display module assembly, said front cover and said knob bracket defining a gap there-between; and
a panel having an opening formed therein, said panel having a back surface, said knob rear assembly being directly or indirectly fixed to said back surface of said panel, said knob front assembly at least partially passes through said opening such as to be mounted to said knob rear assembly.

2. The electrical appliance device according to claim 1, wherein:
said knob bracket has an inner ring with a plurality of knob bracket guide grooves formed therein and evenly distributed on said inner ring;
said hollow rotary encoder has an outer ring with a plurality of rotary encoder outer ring guide grooves formed therein and evenly distributed on said outer ring; and
said knob bracket guide grooves and said rotary encoder outer ring guide grooves have an amount that is greater than or equal to three, and said knob bracket guide grooves and said rotary encoder outer ring guide grooves are capable of forming a tooth-like occluded relationship corresponding to each other.

3. The electrical appliance device according to claim 1, further comprising a circuit board box for covering and protecting said knob rear assembly and is attached between said knob rear assembly and said panel.

4. The electrical appliance device according to claim 3, wherein said circuit board box is a separate member or a member integrally formed on a back surface of said panel.

5. The electric appliance device according to claim 1, wherein said knob further includes a fixing member for fixing said knob front assembly and said knob rear assembly together in a front-rear direction in a manner that said knob front assembly is capable of rotating freely, and said fixing member is an elastic clamp spring.

6. The electric appliance device according to claim 1, further comprising:
a plurality of button transmission members disposed on said knob bracket; and
a plurality of mechanical buttons disposed on said circuit board, such that said knob front assembly is capable of actuating said plurality of button transmission members to cause said plurality of button transmission members to press said plurality of mechanical buttons in a one-to-one correspondence when said knob front assembly is pressed.

7. The electrical appliance device according to claim 1, wherein said display module assembly includes a display screen, a display screen base, and a sensor disposed on said display screen or inside said display screen, said sensor includes one or both of a gesture control sensor and a proximity induction sensor.

8. The electrical appliance device according to claim 1, wherein the electrical appliance device is a washing machine, a clothes dryer, a refrigerator, a dishwasher or a cook top.

* * * * *